United States Patent
Dewey et al.

(10) Patent No.: US 6,532,244 B1
(45) Date of Patent: Mar. 11, 2003

(54) METHOD AND APPARATUS FOR PROVIDING A UNIFORM BEAM FROM A LASER-LIGHT-SOURCE

(75) Inventors: David A. Dewey, Sunnyvale, CA (US); Lukas Hunziker, Belmont, CA (US)

(73) Assignee: Lumenis Inc., Norwood, MA (US)

( * ) Notice: Subject to any disclaimer, the term of this patent is extended or adjusted under 35 U.S.C. 154(b) by 214 days.

(21) Appl. No.: 09/615,493

(22) Filed: Jul. 13, 2000

(51) Int. Cl.[7] .............. H01S 3/13; H01S 3/30; G02B 6/26
(52) U.S. Cl. .............. 372/29.014; 372/6; 372/108; 385/31; 385/32; 385/33
(58) Field of Search .............. 372/6, 18, 19, 372/108, 29.014; 385/31, 32, 33

(56) References Cited

U.S. PATENT DOCUMENTS

| | | | |
|---|---|---|---|
| 5,044,717 A | 9/1991 | Levatter | 385/33 |
| 5,530,709 A | 6/1996 | Waarts et al. | 372/6 |
| 5,818,630 A | * 10/1998 | Fermann et al. | 372/19 |

FOREIGN PATENT DOCUMENTS

EP    184432    * 6/1986

OTHER PUBLICATIONS

M.C. Fenning, D.Q. Brown & J.D. Chapman, "Photodosimetry of interstitial light delivery to solid tumors," *Med. Phys.*, vol. 21, No. 7, Jul. 1994, pp. 1149–1156.

* cited by examiner

Primary Examiner—Minh Loan Tran
(74) Attorney, Agent, or Firm—Eitan, Pearl, Latzer & Cohen-Zedek

(57) ABSTRACT

An illumination system includes a multimode diode-laser and two optical fibers. Light from the diode-laser is directed into the first optical fiber having a first core diameter. The light exits the first optical fiber and is directed by an optical system into a second optical fiber having a core diameter greater than the first optical fiber and a numerical aperture greater than the numerical aperture of the optical system. A light beam exiting the second optical fiber has an intensity distribution having sharp edges and uniformity better than plus or minus ten percent over a central ninety percent of the beam.

22 Claims, 6 Drawing Sheets

METHOD AND APPARATUS FOR PROVIDING A UNIFORM BEAM FROM A LASER-LIGHT-SOURCE

TECHNICAL FIELD OF THE INVENTION

The present invention is directed in general to optical arrangements for projecting light output of lasers. The invention is directed in particular to an optical arrangement for projecting a uniform beam from the output of a multi-mode diode-laser.

DISCUSSION OF BACKGROUND ART

Semiconductor diode-lasers are finding application as sources of therapeutic treatment radiation in many types of scientific and medical apparatus. They have advantages in that they are small, efficient, reliable, and can have emission wavelengths selected within a wide range of wavelengths by appropriate selection of the composition of active semiconductor materials of the diode-lasers.

Diode-lasers used in medical apparatus in particular are multimode diode-lasers. The multimode operation results from providing a relatively wide active-region in the diode-laser to increase the amount of power generated by the laser. The wide active-region gives rise to multiple transverse lasing modes. A disadvantage of a multimode diode-laser is that light output from an emitting aperture of the laser which may be as much as 100 times as wide as it is high provides a highly elliptical output beam. The light diverges relatively narrowly, for example at about 10 degrees in the width direction of the aperture (the slow axis), and more widely, for example at about 35 degrees in the height direction (fast axis) of the aperture.

Light output from a multimode diode-laser is often transported to a point of use by an optical fiber. The diode-laser-light is collected into optical fiber by a lens, for example, a cylindrical lens disposed between the diode-laser and the optical fiber and aligned in the slow axis. The combination of the lens and the optical fiber provides for a certain degree of "circularization" of the diode-laser-light output. Typically, light is output from the optical fiber as a beam having a generally circular cross-section and a numerical aperture (divergence) which is about the average of the numerical aperture of the diode-laser output in the fast and slow axes. A significant problem, however, is that the intensity distribution of light output of the optical fiber in the near field is uneven due to the multiple modes propagated in the optical fiber. This uneven intensity distribution as well as the numerical aperture of the optical fiber output can fluctuate due to temporal changes in the light output of the diode-laser or changes in orientation or bending of the optical fiber.

SUMMARY OF THE INVENTION

The present invention is directed to a method and apparatus for delivering a laser beam from a laser via an optical fiber with the laser beam having a substantially uniform near-field intensity distribution on delivery from the optical fiber, for example, with variation less than about ±10 percent of a nominal average. The uniform laser beam may be delivered to an optical apparatus for use therein. In one aspect, apparatus in accordance with the present invention includes a laser delivering a beam of laser-light in one or more modes and first and second multimode optical fibers.

An optical arrangement receives the laser-light from the laser and directs the laser-light into the first optical fiber at an entrance end thereof. The first optical fiber is configured such that the laser-light exits the first optical fiber at an exit end thereof in a second number of modes, the second number of modes being greater than the first number of modes. An optical system receives the laser-light exiting the first optical fiber and directs the laser-light into the second optical fiber at an entrance end thereof. The second optical fiber is configured such that the laser-light exits the second optical fiber at an exit end thereof as an output beam in a third number of modes, the third number of modes being greater than the second number of modes.

Increasing the number of modes in the laser-light by transporting the laser-light through the second optical fiber combined with mixing of the modes within the second optical fiber provides that the near field uniformity of intensity of the output beam at the exit end of the second optical fiber is better than the near-field uniformity of intensity of the laser-light beam emitted at the exit end of the first optical fiber.

In one embodiment of the present invention, a portion of the second optical fiber is retained in the form of one or more bends. Selecting an appropriate number and radius of curvature of the one more bends provides that the near-field intensity distribution across the output beam is substantially constant or uniform.

In one particular example of apparatus in accordance with the present invention, the apparatus is directed to providing a beam of substantially uniform intensity distribution and variable size at a focal plane of an ophthalmic slit-lamp microscope for use in treatment of age-related macular degeneration. The laser is a multimode diode-laser emitting at a wavelength of about 689 nanometers (nm). The first optical fiber has a core diameter of 100.0 $\mu$m and length of about 1.0 meters (m). The second optical fiber has a core diameter of 200.0 $\mu$m and a length of about 3 m. A portion of the second optical fiber is retained in a loop or 360° bend having a diameter of about 30 millimeters (mm). The output beam at the end of the second optical fiber has a uniformity of intensity better than ±10% over a central 90% of the beam. A second optical system receives the output beam and provides a magnified image of the end of the optical fiber at a focal plane of the slit-lamp microscope. The image, of course, has essentially the same uniformity of illumination intensity as the output beam at the end of the optical fiber. The second optical system is a zoom optical system arranged such that the image can be selectively adjusted in diameter between about 0.4 mm and 5.0 mm.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the invention.

DETAILED DESCRIPTION OF THE INVENTION

Figure 1:
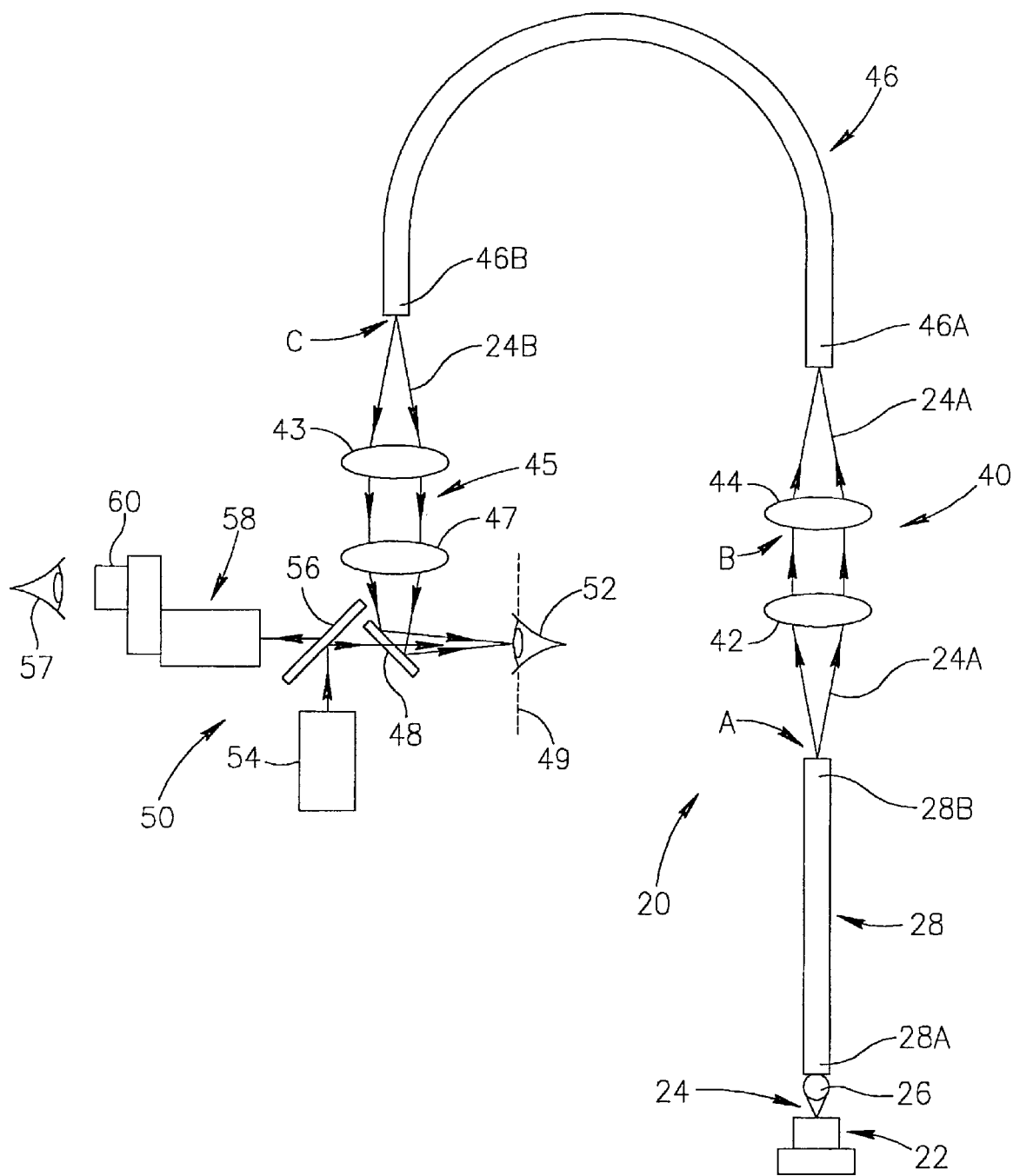
FIG. 1 schematically illustrates one preferred embodiment of apparatus in accordance with the present invention including a multimode diode-laser, a cylindrical lens directing light from a diode-laser into a first multimode optical fiber, a first optical system directing diode-laser-light received from the first optical fiber into a second multimode optical fiber and a second optical system directing light received from the second optical fiber to a focal plane of a slit-lamp microscope.

Referring to FIG. 1, one preferred embodiment 20 of apparatus in accordance with the present invention includes a multimode diode-laser 22, here, illustrated with the slow axis and fast axes thereof respectively perpendicular to and in the plane of the drawing. Diode-laser 22, here, has an emitting aperture (not visible in FIG. 1) having a height of about 1 μm and a width of about 100 μm. A beam of light 24 output by the diode-laser is collected by a cylindrical lens 26 into a multimode optical fiber 28 having-input and output ends 28A an 28B respectively. Those skilled in the art will recognize that more complex optical arrangements for collecting and delivering light to optical fiber 28 may be used without departing from the spirit and scope of the present invention.

Optical fiber 28 has a core diameter of 100 μm and preferably has a numerical aperture equal to or greater than the numerical aperture of light output in the slow axis by diode-laser 22. The core diameter is selected such that the optical fiber can support a number of transmission modes for light 24 greater than the number of modes emitted by the diode-laser. Cylindrical lens 26 reduces the fast axis divergence of diode-laser-light 24 to allow it to be accepted by optical fiber 28. In this example optical fiber 28 has an intrinsic numerical aperture of 0.22. Diode-laser-light 24 emerges therefrom as a beam 24A with a numerical aperture of about 0.15.

Light 24 includes contributions from multiple transverse operating modes of diode-laser 22. Each one of these operating modes can be transmitted along optical fiber 28 in a number of modes characteristic of the fiber. Accordingly, if a number N modes is output by diode-laser 22 then a*N (where a>1 and is characteristic of the optical fiber) modes are transmitted along optical fiber 28.

Figure 2:
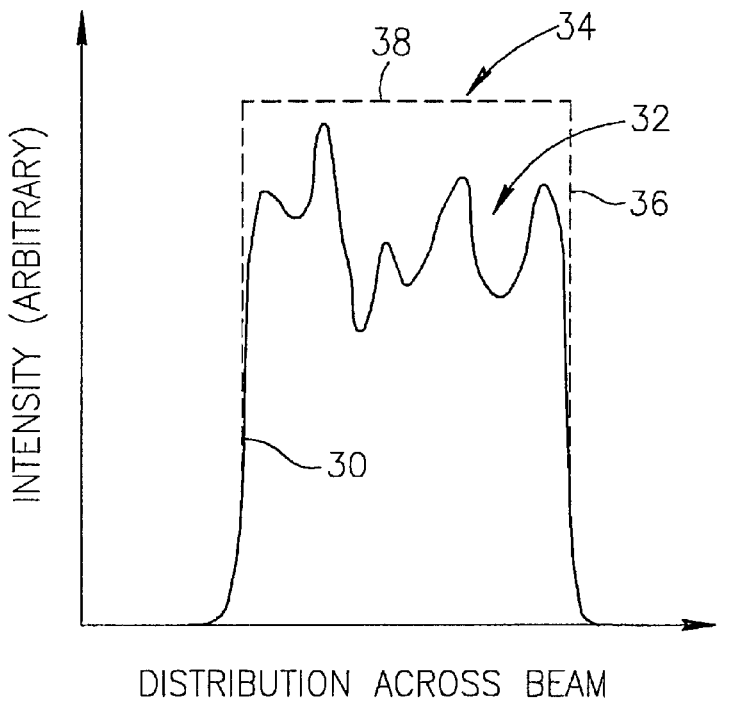
FIG. 2 is a graph schematically illustrating near-field intensity distribution of light output from the first optical fiber of FIG. 1.

FIG. 2 schematically illustrates the intensity distribution (curve 30) of light emitted from output end 28B (beam 24A) of optical fiber 28 at a near-field position indicated in FIG. 1 by arrow A. The beam is essentially circularized by transmission along optical fiber 28. Intensity at the edges of the distribution rises (or falls) sharply. However, intensity distribution in region 32 of curve 30 is very non-uniform or uneven. This results, inter alia, from the mode interaction of transmitted modes and, as noted above, is subject to change with changes in orientation of the optical fiber. The intensity distribution of FIG. 2 is not atypical of prior-art diode-laser-light delivery systems wherein only a single optical fiber is used for the laser-light delivery. An ideal intensity distribution would appear-as depicted in FIG. 2 by dashed curve 34, i.e., with sharp (vertical) rising and (or falling) sides 36 and a flat (constant intensity) top 38. This type of intensity distribution is often referred to in the art as a "top-hat" distribution.

Continuing now with reference again to FIG. 1, light from beam 24A emitted from optical fiber 28 is received by an optical system 40 including lenses 42 and 44. Here it should be noted that while lenses 42 and 44 are depicted schematically in FIG. 1 as single optical elements, these lenses may include two or more such elements. Optical system 40 should also be considered as being exemplary and may include more than two lenses as is known in the art. Optical system 40 focuses light 24A into an entrance end 46A of a multimode optical fiber 46. Lens 42 is preferably arranged to form an intermediate image of exit end 28B of optical fiber 28 in a position approximately located on lens 44 as depicted in FIG. 1 by arrow B. This minimizes the influence of fluctuations in the far-field output distribution of optical fiber 28 on the angular distribution of light 24B delivered into optical fiber 46.

It should be noted here that optical fibers 28 and 46 discussed herein are depicted, for simplicity, without cladding or protective sheathing. Those skilled in the art, however, will recognize that cladding and/or sheathing of fibers are usual in such an application. Those skilled in the art will also recognize that these are passive optical fibers which do not provide any amplication of light transported therealong.

Optical fiber 46 preferably has a product of core diameter and numerical aperture greater than the product of core diameter and numerical aperture of optical fiber 28. This enables it to support more transmission modes than optical fiber 28. In this example, a core diameter of 200 μm and an intrinsic numerical aperture of 0.22 is selected for optical fiber 46. Such an optical fiber having a pure silica core is readily commercially available. A pure silica core is preferred for its advantageous power handling and transmission properties. Optical system 40 has a numerical aperture of 0.10, i.e., smaller than the intrinsic numerical aperture of optical fiber 46. Accordingly, optical fiber 46 is not filled by light 24A directed into it by optical system 40. Under-filling the numerical aperture of optical fiber 46, inter alia, provides that light 24B output by the optical fiber also has a numerical aperture of 0.10. In the example of apparatus 20, this is required to fit the output light into a slit-lamp microscope described herein below.

In apparatus 20, optical fiber 28 has a length of about 1.0 m and optical fiber 46 has a length of about 3.0. Generally, a combined length of about 0.2 m or greater is preferred to allow adequate mode mixing. More preferably the length of any individual fiber is about 0.2 m or greater. However the length of any individual optical fiber is preferably less than 10.0 m to prevent the optical fiber from being filled by the light input. Preventing filling of the optical fiber by the light input, as discussed above, allows the light output to exit the optical fiber with the same numerical aperture as the numerical aperture of the light input.

As noted above, light 24B emerging from optical fiber 46 includes contributions from a*N modes delivered at input end 46A of optical fiber 46. Each of these modes can propagate in optical fiber 46 in a number of modes characteristic of the optical fiber. Accordingly, the number of modes emerging from output end 46B of optical fiber 46 can be defined as a*b*N (where b is a number greater than 1 and characteristic of optical fiber 46).

A zoom optical system 45 is arranged to provide, via a fold mirror 48, a magnified image of output end 46B of optical fiber 46 at a plane 49 which, in this example, is the focal plane of an ophthalmic, slit-lamp microscope assembly 50. The image size is selectively adjustable between 0.4 millimeters (mm) and 5.0 mm in diameter. Optical system 45 is depicted here, for simplicity, as including only two lenses 43 and 47. Those skilled in the art will recognize that a well-corrected zoom optical system typically includes more than two lens elements. A preferred arrangement for optical system 45 includes four lens elements, two thereof fixed and two thereof movable to allow variable spacing between the elements.

Figure 3:
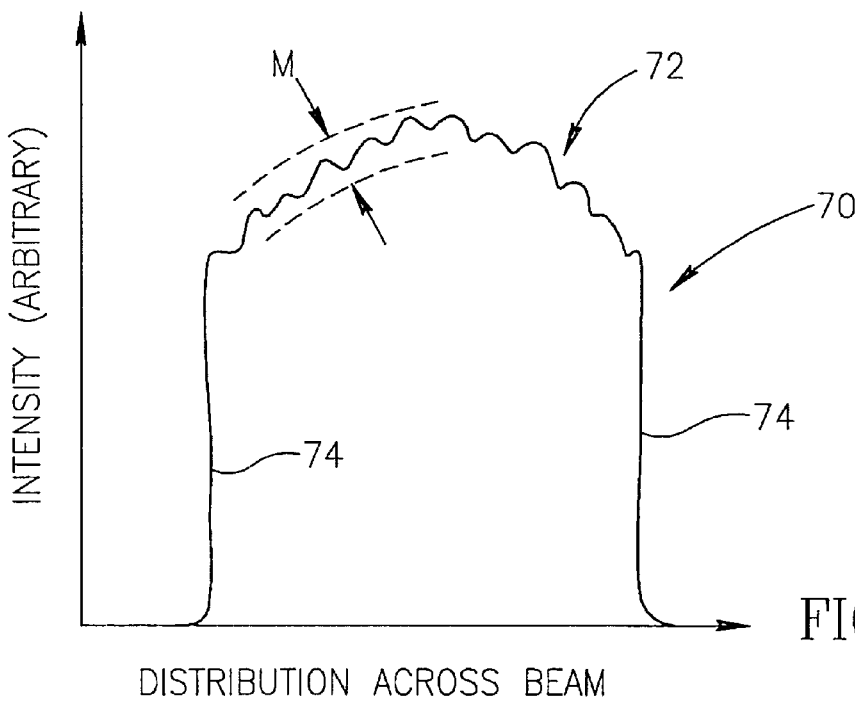
FIG. 3 is a graph schematically illustrating near-field intensity distribution of light output from the second optical fiber of FIG. 1.

A patient's eye 52 receives light 24B for treatment. In this example eye 52 is being treated by photodynamic therapy (PDT) for age-related macular degeneration (AMD). Light 24 is the treatment light. Fold mirror 48 is coated to provide reflection at the wavelength of light 24, here 689 nm, and transmission at shorter (visible light) wavelengths. The eye 52 is illuminated by a slit-lamp 54 via a fold mirror 56 which is partially reflective and partially transmissive for visible light. The treatment is observed (eye 57) through a microscope 58 having binocular eyepieces 60 (only one depicted in FIG. 1). It should be noted here that slit-lamp microscope 50 is depicted simply and schematically in FIG. 1 merely for illustrating a preferred application of apparatus in accordance with the present invention. Slit ophthalmic microscopes are well known to those skilled in the art. A detailed description and depiction of such a microscope is not necessary for understanding principles of the present invention and, accordingly, is not presented herein FIG. 3 schematically illustrates the intensity distribution (curve 70) of light emitted from output end 46B of optical fiber 46 at a near-field position indicated in FIG. 1 by arrow C. It can be seen in region 72 of curve 50 that unevenness of intensity distribution is greatly reduced compared with the distribution of FIG. 2. There is a greater number of ripples or a greater modulation frequency, however, the depth of the ripples, or modulation, (indicated by arrows M) is significantly less than the fluctuations in region 32 of curve 30 (see FIG. 2). This results from a mode mixing effect provided by the increase in the number of modes resulting from the above-discussed mode-multiplying effect of optical fiber 46.

The reduction of ripple or modulation depth minimizes the fluctuation of energy at the site of delivery, in this example the retina of a patients eye. Fluctuations in the distribution are generally within the ripple or modulation depth. It can also be seen that intensity at edges 74 of the distribution rises (or falls) sharply, closely approximating edges of a top-hat distribution. Curve 70 departs from the ideal top-hat distribution, however, inasmuch as highest intensity is located toward the center of the distribution curve. An arrangement for "flattening" the intensity distribution of light emerging from optical fiber 46 is described below with reference to FIG. 4.

Figure 4:
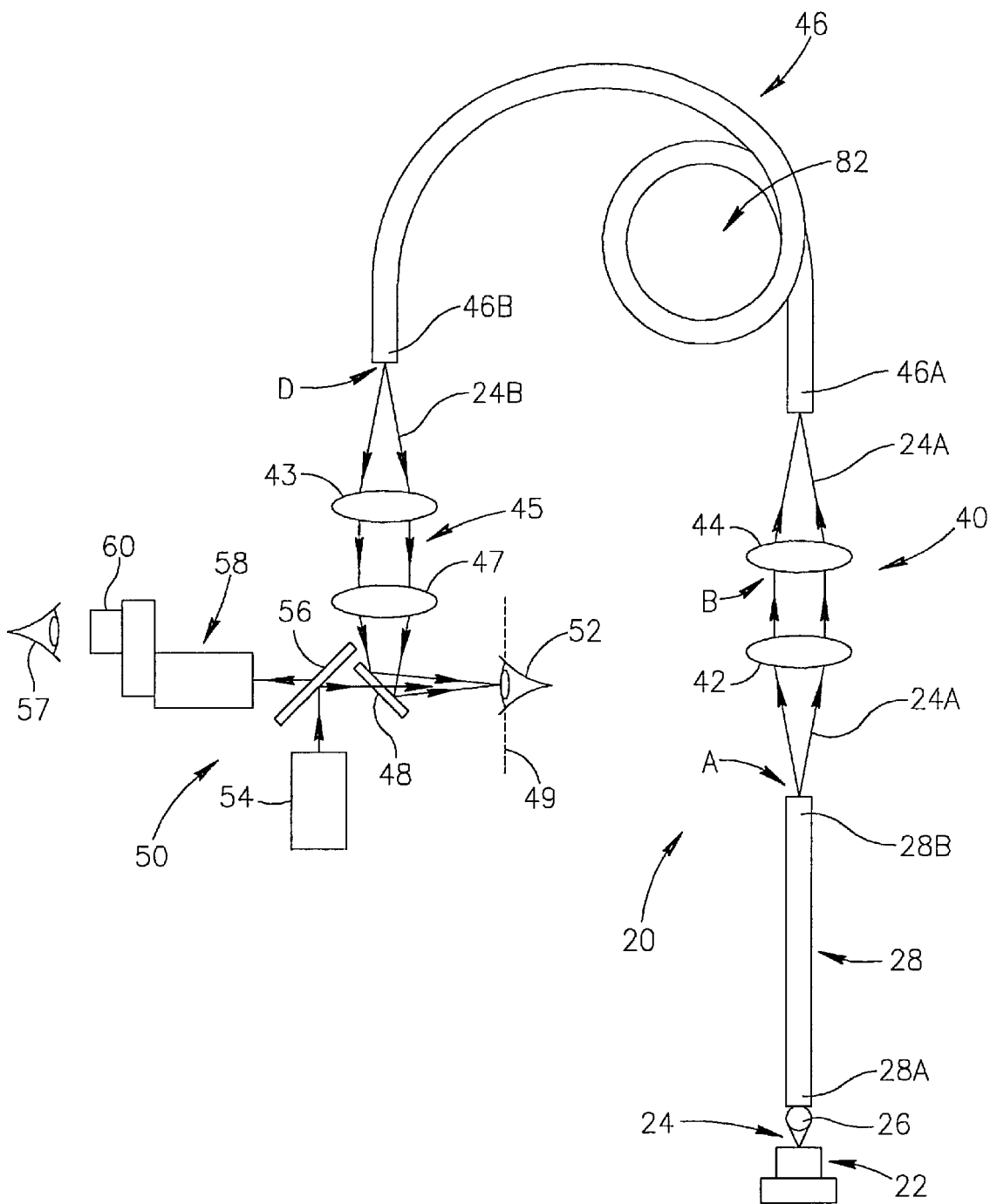
FIG. 4 schematically illustrates another preferred embodiment of apparatus in accordance with the present invention similar to the apparatus of FIG. 1 but wherein a 360° bend is formed in the second optical fiber.

In FIG. 4, another preferred embodiment 80 of apparatus in accordance with the present invention is similar to apparatus 20 of FIG. 1 with an exception that optical fiber 46 has a loop 82 or bend formed therein. It has been found that if loop 82 has a sufficiently small diameter, the intensity distribution of light at the output end 46B can be "flattened" to generally equalize intensity at the center and edges of the near field distribution without increasing the numerical aperture of the far-field distribution.

Figure 5:
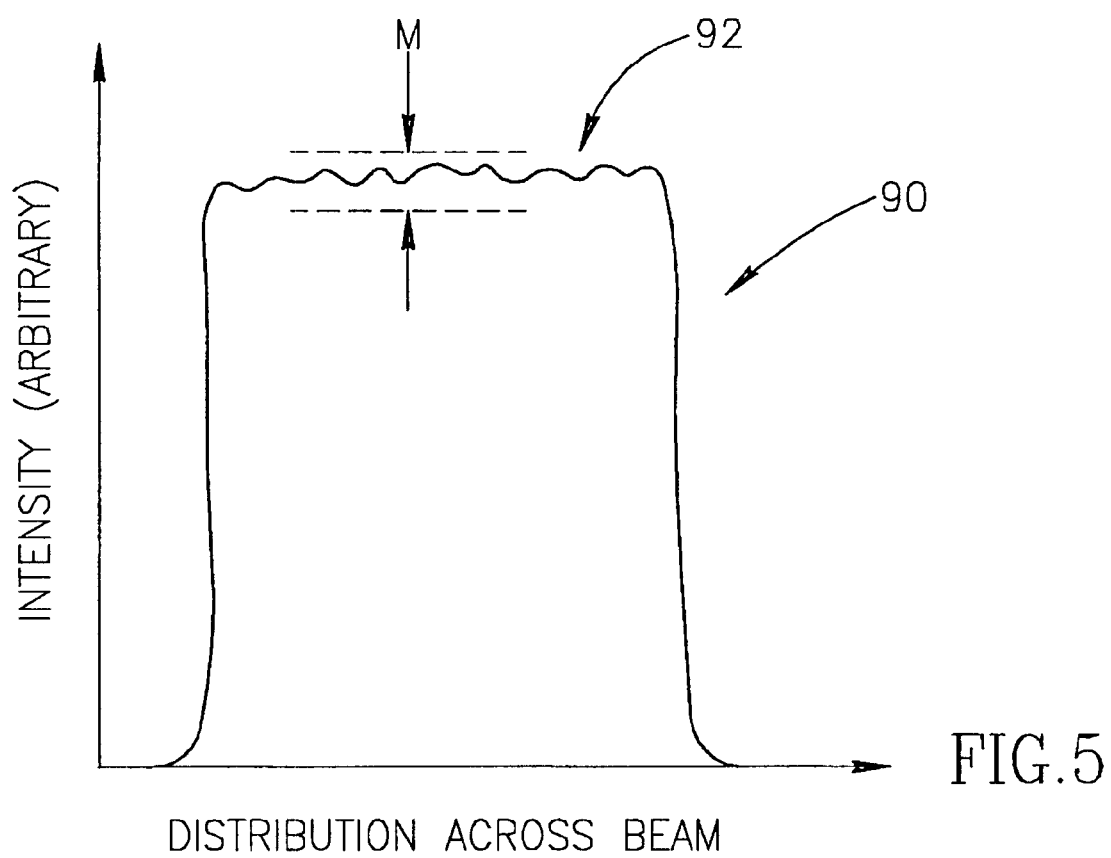
FIG. 5 is a graph schematically illustrating near-field intensity distribution of light output from the second optical fiber of FIG. 4.

FIG. 5 schematically illustrates the intensity distribution (curve 90) of light 24B emitted from output end 46B of optical fiber 46 including loop 82 at a near-field position indicated in FIG. 4 by arrow D. It can be seen that in region 92 of curve 90 the modulation depth (M) of the intensity distribution is about the same as in region 72 of FIG. 3, and the steeply rising or falling edges of the distribution of FIG. 3 are preserved. Generally, however, the intensity is about the same at the center of the distribution as at the edges thereby providing a close approximation to the ideal, top-hat or substantially constant intensity distribution.

Regarding loop 82, of optical fiber 46, a single such loop or bend has been found to provide an adequate approximation to the top hat distribution. In the above described example where optical fiber 46 has a core diameter of about 200 $\mu$m and an intrinsic numerical aperture of 0.22, a diameter of about 30.0 millimeters (mm), i.e., a radius of curvature of about 15.0 mm for loop 82 was found effective. It was found that if the diameter (radius of curvature) of loop 82 was made too small, the output numerical aperture of light emerging from optical fiber 46 could exceed the numerical aperture of optical system 45 thereby reducing the general intensity level in an image projected thereby. In this arrangement, a near-field (at exit end 46B of optical fiber 46) uniformity of intensity (including low and high frequency variation) of less than ±10% of a nominal average value was obtained over a central 90% of the light output beam.

It was also determined that, at an optimum diameter for a single loop 82, there was no significant improvement in the distribution curve if a second such loop were formed in the optical fiber. However, the possibility that two or more loops of less than optimum diameter for a single loop may provide a close approximation to top-hat intensity distribution is not precluded.

Some advantageous "distribution-flattening" effect of the loop may also be achieved by forming in fiber 46 a single bend of less than 360 degrees, i.e., less than a complete loop, or by forming the fiber into a succession of such bends in the same or opposite directions. The number and radius of curvature of the bends must be selected, as discussed above, to achieve the distribution-flattening effect.

Figure 6:
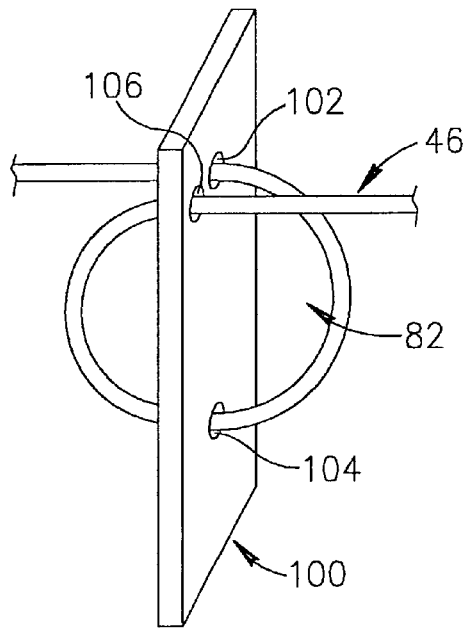
FIG. 6 schematically illustrates details of a retaining arrangement for the 360° optical fiber bend of FIG. 4.

Whatever bending arrangement is selected, it is important that some means be provided to retain the fiber in the selected bent condition. This is required because variations in the fiber bending could result in variations in output beam-uniformity. Further, in the case of relatively tight bends such as the 15 mm radius bend discussed above, retention is necessary to overcome a tendency of the optical fiber to straighten itself under its own spring action. One convenient means of retaining the optical fiber in the 360° bend or loop 82 of FIG. 4 is schematically illustrated in FIG. 6. Here, a retaining board or card 100 has apertures 102, 104 and 106 extending therethrough. Optical fiber 46 is passed successively through apertures 102, 104 and 106 to form the 360° loop or bend 82.

Figure 7:
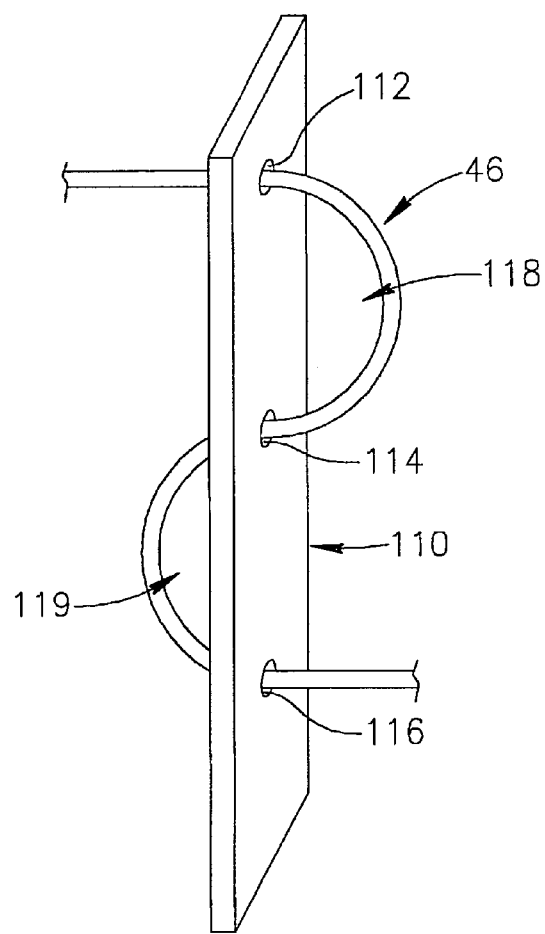
FIG. 7 schematically illustrates details of an alternate bending and retaining arrangement for retaining two 180° bends in the second optical fiber of FIG. 4.

Another bending and retaining arrangement for optical fiber 46 is schematically illustrated in FIG. 7. Here, a retaining board or card 110 has apertures 112, 114 and 116 extending therethrough. Optical fiber 46 is passed successively through apertures 112, 114 and 116 and retained in a serpentine form including two 180° bends 118 and 119 in opposite directions.

Figure 8A:
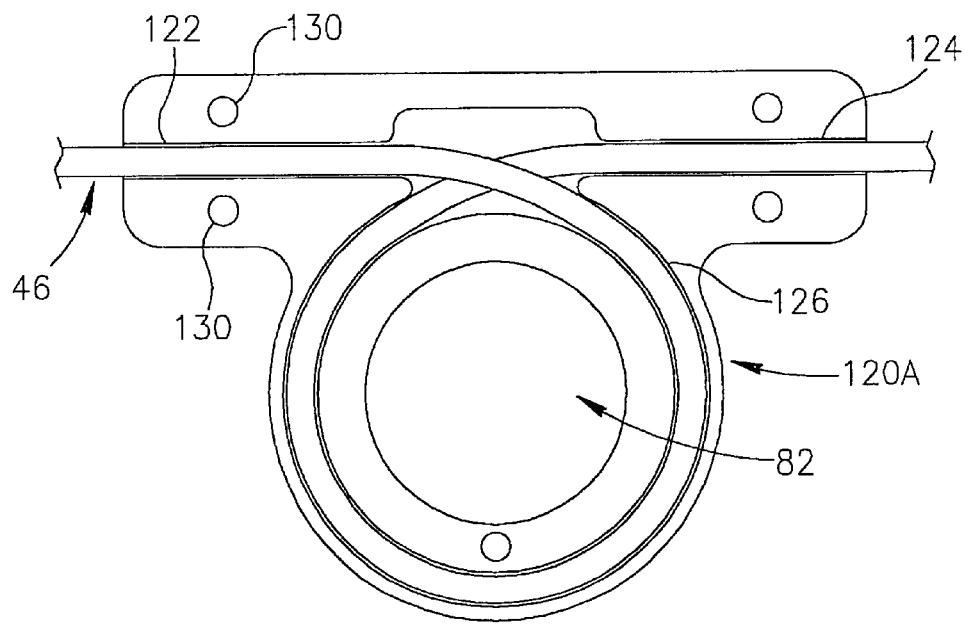
FIGS. 8A and 8B schematically illustrate details of another retaining arrangement for the 360° optical fiber bend of FIG. 4.
Figure 8B:
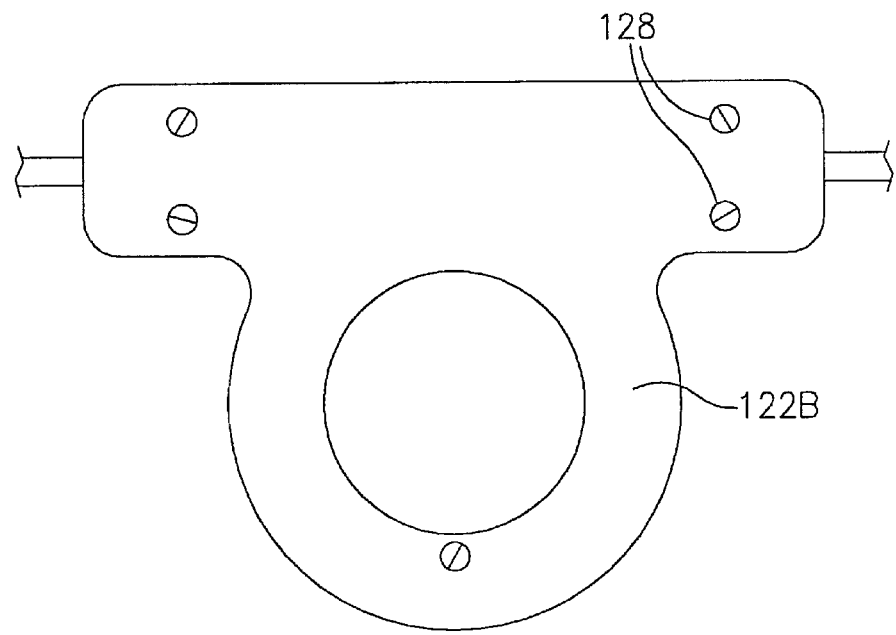

Yet another, non-exhaustive, bending and retaining arrangement is schematically depicted in FIGS. 8A and 8B. This arrangement is particularly suitable for maintaining a loop 82 in a sheathed optical fiber 46. In this arrangement, a machined plastic component 120A includes longitudinal grooves 122 and 124 intersecting a circular groove 126. Optical fiber 46 is laid first into longitudinal groove 122, then laid into circular groove 126 and longitudinal groove 124 to form loop 82. Once the optical fiber is thus laid into the grooves, component 120A is covered by a mating component 120B including mating grooves (not shown). Components 120A and 120B are then secured together by screws 128 via apertures 130 in the mating components.

The present invention is described above with reference to delivering light from a multimode diode-laser into an ophthalmic slit-lamp microscope assembly for providing PDT treatment for age-related macular degeneration. The apparatus and method of the present invention, however, is not limited to the exemplified use nor to delivering light from multimode diode-lasers. The invention is applicable to delivering light from any other laser, either single mode or multimode, emitting radiation which can be transmitted along a multimode optical fiber. From the description of the present invention provided herein, those skilled in the art to which the invention pertains may devise other embodiments and uses thereof without departing from the spirit and scope of the invention as defined by the claims appended hereto.

What is claimed is:

1. A laser-light delivery apparatus, comprising:
   a laser delivering a beam of laser-light in a first number of modes, said first number of modes being greater than or equal to one, and first and second multimode optical fibers;
   an optical arrangement for receiving said laser-light from said laser and directing said laser-light into said first optical fiber at an entrance end thereof, said first optical fiber being configured such that said laser-light exits said first optical fiber at an exit end thereof in a second number of modes said second number of modes being greater than said first number of modes; and
   an optical system for receiving said laser-light exiting said first optical fiber and directing said laser-light into said second optical fiber at an entrance end thereof, said second optical fiber being configured such that said laser-light exits said second optical fiber at an exit end thereof as an output beam in a third number of modes said third number of modes being greater than said second number of modes, and wherein the near field intensity distribution of the output beam at said exit end of said second optical fiber is more uniform than the near-field intensity distribution of said laser-light exiting said first optical fiber at said exit end thereof.

2. The apparatus of claim 1, wherein a portion of said second optical fiber is retained in the form one or more bends, the number and radius of curvature of said one or more bends being selected to further improve the uniformity of said near-field intensity distribution.

3. The apparatus of claim 2, wherein said near-field intensity distribution of said output beam is within about ±10 percent of a nominal average intensity over about a central 90 percent of said output beam.

4. The apparatus of claim 1, wherein said second optical fiber has a product of core diameter and numerical aperture greater than the product of core diameter and numerical aperture of said first optical fiber.

5. The apparatus of claim 4, wherein said second optical fiber has an intrinsic numerical aperture greater than the numerical aperture of said optical system.

6. The apparatus of claim 1, wherein said first and second optical fibers have a combined length greater than about 0.2 meters.

7. The apparatus of claim 6, wherein said first and second optical fibers have a length between about 0.2 and 10.0 meters.

8. The apparatus of claim 7, wherein said first optical fiber has a length of about 1.0 meters and said second optical fiber has a length of about 3.0 meters.

9. The apparatus of claim 1, wherein a portion of said second optical fiber is retained in the form of one or more bends, the number and radius of curvature of said one or more bends being selected to further improve the uniformity of said near-field intensity distribution.

10. A laser-light delivery apparatus, comprising:
    a diode-laser delivering a beam of laser-light in a first number of modes, said first number of modes being greater than or equal to one, and first and second multimode optical fibers, said first and second optical fibers having a combined length greater than about 0.2 meters and each thereof having a length less than about 10.0 meters, said second optical fiber having a product of core diameter and numerical aperture greater than the product of core diameter and numerical aperture of said first optical fiber;
    an optical arrangement for receiving said laser-light from said laser and directing said laser-light into said first optical fiber at an entrance end thereof, said first optical fiber being configured such that said laser-light exits said first optical fiber at an exit end thereof in a second number of modes, said second number of modes being greater than said first number of modes; and
    an optical system for receiving said laser-light exiting said first optical fiber and directing said laser-light into said second optical fiber at an entrance end thereof, said second optical fiber being configured such that said laser-light exits said second optical fiber at an exit end thereof as an output beam in a third number of modes said third number of modes being greater than said second number of modes, and wherein a portion of said second optical fiber is retained in the form of one or more bends, the number and radius of curvature of said one or more bends being selected to improve the uniformity of the near field intensity distribution of the output beam at said exit end of said second optical fiber.

11. The apparatus of claim 10, wherein said first optical fiber has a length of about 1.0 meters and said second optical fiber has a length of about 3.0 meters.

12. The apparatus of claim 11, wherein said second optical fiber is retained in a 360 degree bend having a radius of curvature of about 15 millimeters.

13. The apparatus of claim 10, wherein said near field intensity distribution of said output beam is within about ±10% of a nominal average intensity across about a central 90% of said output beam.

14. A laser-light delivery apparatus for delivering laser-light to a focal plane of an ophthalmic slit-lamp, microscope assembly, comprising:
    a diode-laser delivering a beam of laser-light in a first number of modes, said first number of modes being greater than or equal to one;
    first and second multimode optical fibers;
    an optical arrangement for receiving said laser-light from said laser and directing said laser-light into said first optical fiber at an entrance end thereof, said first optical fiber being configured such that said laser-light exits said first optical fiber at an exit end thereof with a first near-field intensity distribution and in a second number of modes, said second number of modes being greater than said first number of modes;

a first optical system for receiving said laser-light exiting said first optical fiber and directing said laser-light into said second optical fiber at an entrance end thereof, said second optical fiber being configured such that said laser-light exits said second optical fiber at an exit end thereof as an output beam having a second near field intensity distribution and in a third number of modes, said third number of modes being greater than said second number of modes and second near-field intensity distribution being more uniform than said first near field intensity distribution; and a second optical system cooperative with the ophthalmic slit-lamp microscope assembly and arranged to receive said output beam and form an image of said exit end of said second optical fiber at the focal plane of the ophthalmic slit-lamp microscope assembly.

15. The apparatus of claim 14, said first and second optical fibers have a combined length greater than about 0.2 meters and each thereof has a length less than about 10.0 meters.

16. The apparatus of claim 14, wherein said near field intensity distribution of said output beam is within about ±10% of a nominal average intensity across about a central 90% of said output beam.

17. The apparatus of claim 14, wherein said second optical fiber has an intrinsic numerical aperture greater than the numerical aperture of said first optical system.

18. The apparatus of claim 17, wherein said output beam has the same numerical aperture as said first optical system.

19. The apparatus of claim 14, wherein said second optical fiber has a product of core diameter and numerical aperture greater than the product of core diameter and numerical aperture of said first optical fiber.

20. A method of delivering laser-light from a laser to an optical apparatus for use therein, the laser-light being emitted by the laser in one or more modes as a beam having a near-filed uniformity which is characteristic of the laser, the method comprising the steps of:

(a) directing laser-light from the laser-light beam into a first multimode optical fiber at an entrance end thereof, said first optical fiber being configured such that said laser-light is emitted thereby at an exit end thereof and having a first number of modes, said first number of modes being greater than the number of modes emitted by said laser;

(b) directing laser-light emitted from the exit end of said first optical fiber into a second multimode optical fiber, said second optical fiber being configured such that said laser-light is emitted thereby at an exit end thereof and having a second number of modes, said second number of modes being greater than said first number of modes; and (c) delivering light emitted from the exit end of the second fiber to the optical apparatus.

21. The apparatus of claim 20, wherein a portion of said second optical fiber is retained in the form of one or more bends, the number and radius of curvature of said one or more bends being selected such that the uniformity of near-field intensity distribution of said delivered light at said exit end of said second optical fiber is improved.

22. The method of claim 21, wherein said first and second optical fibers have a combined length greater than about 0.2 meters and each thereof has a length less than about 10.0 meters, and said second optical fiber has a product of core diameter and numerical aperture greater than the product of core diameter and numerical aperture of said first optical fiber.

* * * * *